US010095107B2

(12) United States Patent
Chiu et al.

(10) Patent No.: US 10,095,107 B2
(45) Date of Patent: Oct. 9, 2018

(54) COMPOSITION AND FABRICATING METHOD THEREOF, AND INFRARED RAY SENSOR

(71) Applicant: eChem Solutions Corp., Taoyuan (TW)

(72) Inventors: Chen Wen Chiu, Taoyuan (TW); Chia Hao Lou, Taoyuan (TW); Ya Ting Chen, Taoyuan (TW)

(73) Assignee: eChem Solutions Corp. (TW)

(*) Notice: Subject to any disclaimer, the term of this patent is extended or adjusted under 35 U.S.C. 154(b) by 237 days.

(21) Appl. No.: 15/288,172

(22) Filed: Oct. 7, 2016

(65) Prior Publication Data

US 2017/0102610 A1 Apr. 13, 2017

(30) Foreign Application Priority Data

Oct. 8, 2015 (TW) ............................ 104133186 A

(51) Int. Cl.

| | |
|---|---|
| ***G03F 7/038*** | (2006.01) |
| ***G02B 5/20*** | (2006.01) |
| ***G03F 7/00*** | (2006.01) |
| ***H01L 27/146*** | (2006.01) |
| ***G01J 1/04*** | (2006.01) |
| ***G01J 1/44*** | (2006.01) |
| ***G03F 7/004*** | (2006.01) |
| ***G03F 7/031*** | (2006.01) |
| ***G03F 7/032*** | (2006.01) |
| ***G03F 7/16*** | (2006.01) |
| ***G03F 7/20*** | (2006.01) |
| ***G03F 7/32*** | (2006.01) |
| ***G03F 7/40*** | (2006.01) |
| *G02B 5/22* | (2006.01) |

(52) U.S. Cl.

CPC .......... *G03F 7/0007* (2013.01); *G01J 1/0437* (2013.01); *G01J 1/0488* (2013.01); *G01J 1/44* (2013.01); *G03F 7/0045* (2013.01); *G03F 7/0048* (2013.01); *G03F 7/031* (2013.01); *G03F 7/032* (2013.01); *G03F 7/038* (2013.01); *G03F 7/162* (2013.01); *G03F 7/168* (2013.01); *G03F 7/2004* (2013.01); *G03F 7/327* (2013.01); *G03F 7/40* (2013.01); *H01L 27/14625* (2013.01); *G01J 2001/446* (2013.01); *G02B 5/208* (2013.01); *G02B 5/223* (2013.01)

(58) Field of Classification Search

CPC ........ G03F 7/0007; G03F 7/031; G03F 7/032; G03F 7/038; G02B 5/208; G02B 5/223; H01L 27/14625

USPC .............................................................. 430/7

See application file for complete search history.

(56) References Cited

U.S. PATENT DOCUMENTS

2014/0145126 A1* 5/2014 Suemitsu ................ G02B 1/04 252/586
2015/0111156 A1* 4/2015 Lee ....................... G03F 7/0384 430/285.1
2015/0293282 A1* 10/2015 Takishita .............. G02B 5/208 359/359
2017/0263663 A1* 9/2017 Nagase .................. G03F 7/004

FOREIGN PATENT DOCUMENTS

TW 201437751 A 10/2014

* cited by examiner

*Primary Examiner* — John A McPherson

(57) ABSTRACT

A composition, a method fabricating the infrared ray transmitting filter, and an infrared ray sensor are provided. When the composition forms a film with a thickness of 1 μm, transmittance of the film in a wavelength in a range from 400 nm to 700 nm is less than 4%, and transmittance of the film in a wavelength in a range from 900 nm to 1300 nm is more than 90%. The composition comprises an alkali-soluble resin at least containing an acrylic group, a carboxyl group, and a fluorene ring, a photoinitiator, an unsaturated monomer, a pigment mixture, and a solvent. The pigment mixture is formed by mixing a colorant dispersion and a pigment in a weight ratio from 60:40 to 70:30.

12 Claims, 3 Drawing Sheets

COMPOSITION AND FABRICATING METHOD THEREOF, AND INFRARED RAY SENSOR

FIELD OF THE INVENTION

The present invention is related to a composition, especially an infrared ray transmitting composition, a method fabricating the infrared ray transmitting filter, and an infrared ray sensor thereof.

BACKGROUND OF THE INVENTION

A color filter is an essential component to a solid-state imaging device or a liquid crystal display. In a conventional fabricating method, a color filter is produced by forming red, green and blue pixels on a substrate via staining, printing, electro-deposition, pigment dispersing, and etc., wherein the pigment dispersing method is the most common way. The pigment dispersing method is firstly to coat the substrate with a resin composition containing pigments, then expose the substrate covered by a mask, and develop after exposing, and consequently the pixels are formed.

Main ingredients of a resin composition used in a conventional pigment dispersing process includes a alkali soluble resin, polymeric monomers, a photoinitiator, pigments, and solvents, wherein a major component of the alkali soluble resin is monomers at least having a hydroxyl group or a carboxylic acid. Chemical structure, acid value, and molecular weight of the monomer have huge impact on the property of the resin composition and desired pattern formed on a substrate. Different resins used in the conventional manufacturing process are, for instance, carboxylic acid resin, alcohol compound resin, acrylic resin, acrylic-epoxy resin, acrylic-styrene resin, phenol-novolak resin. Although performances of a conventional light transmittable resin composition may be sufficient on resolution, adhesiveness, or developing result under visible light, its performances under infrared ray are not sufficient with respects to transmittance, pattern resolution, adhesiveness and developing result. A conventional light transmittable resin composition cannot have high transmittance under infrared ray and low transmittance under visible light at the same time.

In recent years, color filters of a near-infrared-ray-sensing solid-state imaging device are required to be very thin (for example, it is better to be 1 μm in thickness). However, a conventional infrared ray transmitting filter has high transmittance under visible light due to low thickness, and thus sensing accuracy of the near-infrared-ray-sensing solid-state imaging device is low because of interference from visible light. Moreover, the problem of low sensing accuracy is worse with higher degree of miniaturization of pixels. Therefore, the conventional method meets a difficulty to produce a color filter with a resolution lower than 1.1 μm in a near-infrared-ray-sensing solid-state imaging device.

SUMMARY OF THE INVENTION

In view of the above mentioned issues, a subject of the present invention is to achieve the following purposes. The present invention provides a composition, an infrared ray transmitting filter, a fabricating method thereof, and an infrared ray sensor, and the composition is able to form a very thin infrared ray transmitting filter (for example, 1 μm in thickness) with low interference from visible light and able to transmit infrared ray (especially near infrared ray). Therefore, the present invention is able to solve the problem of lacking high transmittance under infrared ray with low interference under visible light when a thickness of the infrared ray transmitting filter is very thin, and the composition and the infrared ray transmitting filter thereof have excellent pattern resolution, good adhesiveness on the substrate, low developing residues, and good spectral characteristics, as the conventional fabrication cannot achieve at the same time.

The inventors of the present invention, after deep and long time studies, have discovered that an alkali soluble resin having a structure of certain series of 9,9-bis(4-hydroxyphenyl)fluorene (also known as bisphenol fluorene) has better performances due to higher thermal stability of ring structures than non-ring structures. Thus, a polymer made of bisphenol fluorene has a better heat resistance, humidity resistance, dielectricity, and mechanical property. And pattern defects, adhesiveness on the substrate, and residues of developing are therefore improved.

In addition, the inventors have also found out that an infrared ray transmitting filter formed by a combination of the fluorene-ring-containing alkali soluble resin, photoinitiator, unsaturated monomers, solvents, and special pigment mixture, can have the above good properties, and thus the present invention can solve the problems of the conventional technique. That is, the present invention is as described below.

[1] The present invention provides a composition, used to form a film having a thickness of 1.0 μm, wherein the film has a transmittance <4% in a wavelength range of 400 nm-700 nm and >90% in a wavelength range of 900 nm-1300 nm, comprising: an alkali soluble resin, including an acrylic group, a carboxyl group, and a fluorene ring; a photoinitiator; an unsaturated monomer; a pigment mixture, having a weight ratio of a colorant dispersion to a pigment in a range of 60:40~70:30; and a solvent.

[2] The composition according to [1], wherein the alkali soluble resin is a bisphenol fluorene acrylate.

[3] The composition according to [1], wherein the photoinitiator is selected from a group consisting of oxime ester compounds, alkyl phenyl ketone compounds, benzoin compounds, benzoin derivatives, and a combination thereof.

[4] The composition according to [1], wherein the unsaturated monomer is a mixture of caprolactone-modified acrylates and epoxy-alkanes-modified polyfunctional-group-containing acrylates.

[5] The composition according to [1], wherein the pigment mixture comprises: a benzodifuranone colorant, having a structure as shown in Formula (Ia) isomers thereof; and a perylene colorant, having a structure as shown in Formula (Ib) or Formula (Ic), wherein $R^1$ and $R^2$ respectively and individually are selected from a group consisting of 1,2-phenylene, 1,8-naphthylene, 1,2-naphthyl ene, 2,3-naphthylene, 2,3-pyridylene and 3,4-pyridylene, and wherein the above phenylenes, naphthylenes and pyridylenes respectively and individually can be mono- or polysubstituted by $C_1$-$C_{12}$ alkyl group, $C_1$-$C_6$ alkoxy group, hydroxyl group, nitro group, and/or halogen; X is a halogen; and n is 0, 1, 2, 3, or 4.

Formula (Ia)

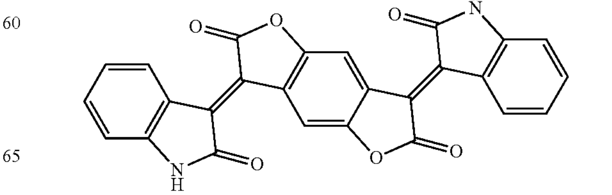

-continued

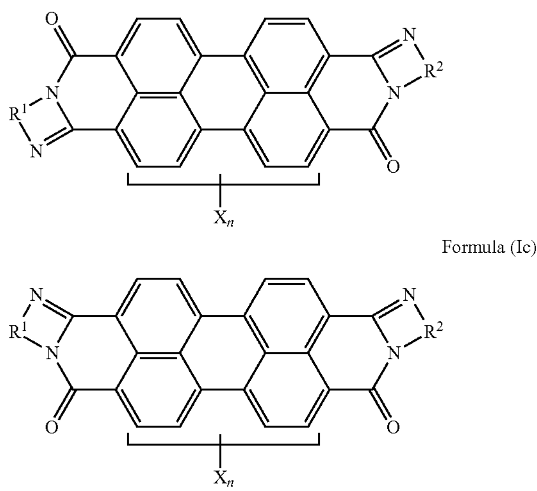

[6] The composition according to [5], wherein a weight ratio of the benzodifuranone colorant to the perylene colorant is in a range of 10:90~80:20.

[7] The composition according to [1], wherein a weight percentage of the solvent to the composition is in a range of 10 wt %~50 wt %; and the composition contains 0.5~10 parts by weight of the alkali soluble resin, 0.1~10 parts by weight of the photoinitiator, 0.5~25 parts by weight of the unsaturated monomer, and 55~98 parts by weight of the pigment mixture per 100 parts by weight of the solid content of the composition.

[8] The composition according to [1], wherein colorant dispersion further includes a dispersant, and a weight percentage of the dispersant to the pigment mixture is less than 40 wt %.

[9] A fabricating method of an infrared ray transmitting filter, comprising: a step of disposing the composition according [1] onto a substrate to form a an infrared ray transmitting layer; a step of exposing the infrared ray transmitting layer through a patterned mask; and a step of developing the exposed infrared ray transmitting layer to pattern the infrared ray transmitting layer.

[10] The composition according to [9], before the step of exposing the infrared ray transmitting layer, further comprising: pre-heating the infrared ray transmitting layer under a temperature in a range of 50° C.~120° C. for 10~300 seconds.

[11] The composition according to [9], after the step of developing the infrared ray transmitting layer, further comprising: post-heating the patterned infrared ray transmitting layer under a temperature in a range of 150° C.~270° C. for 5~30 minutes.

[12] An infrared ray sensor, comprising: a substrate; a solid-state imaging device on the substrate, comprising a plurality of photodiodes and a plurality of transfer electrodes; a light-shielding film, covering the plurality of photodiodes and the plurality of transfer electrodes; a protective film, disposed on the light-shielding film covering the plurality of photodiodes; and the infrared ray transmitting filter disposed on the protective film, formed by the composition as stated in [1].

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
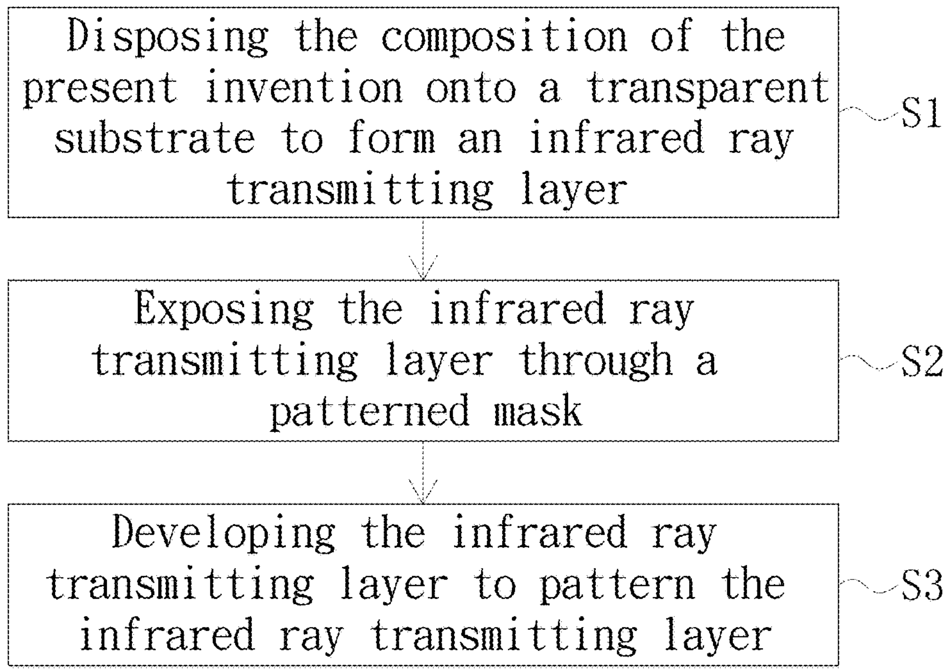
FIG. 1 is flow chart of steps according to a fabricating method of an infrared ray transmitting filter provided by the present invention.

The present invention provides a composition, an infrared ray transmitting filter thereof, a fabricating method of the infrared ray transmitting filter, and an infrared ray sensor. The purpose of the invention is to produce an extra thin infrared ray transmitting filter (i.e. 1 μm in thickness) with properties of low transmittance under visible light (e.g. almost zero transmittance under visible light), high transmittance under infrared ray (e.g. transmittance above 90%), and a resolution lower than 1.1 μm.

It is to be noted that the following descriptions of individual sections regarding to photosensitive insulated resin compositions and method of producing an insulated film with preferred embodiments of this invention are presented herein for purpose of illustration and description only but not intended to be exhaustive or to be limited to the precise form disclosed. Moreover, in the following illustration, the element arranged repeatedly is described in word “one”, “a” or “an” for simpler explanation. However, one skilled in the art should understand the practical structure and arrangement of each element based on the following illustration and figures provided in the present application. And the symbol “~” represents a range of values, which includes both the numbers before and after the symbol “~” as lower and upper limits.

Composition

The composition provided by the present invention is coated onto a substrate and thereby forming a film with a thickness of 1.0 μm. The film have a transmittance under visible light having a wavelength in a range of 400 nm-700 nm less than 4% and a transmittance under infrared ray having a wavelength in a range of 900 nm-1300 nm greater than 90%. The composition comprises (A) an alkali soluble resin, (B) a photoinitiator, (C) an unsaturated monomer, (D) a pigment mixture, and (E) a solvent.

Each of the elements (A) to (E) is illustrated in details in the following description.

(A) Alkali Soluble Resin

The (A) alkali soluble resin at least contains an acrylic group, a carboxyl group, and a fluorene ring. It is preferable to use a resin having bisphenol fluorene as a monomer because its excellent thermal stability is able to improve issues of pattern defects as happened in the conventional technique. In preferred embodiments of the present invention, the (A) alkali soluble resin are selected from at least one of bisphenol fluorene epoxy resin and bisphenol fluorine acrylate. Bisphenol fluorine acrylate is preferably selected because of its excellent heat resistance and better optical property than regular acrylate. For example, the (A) alkali soluble resin of the present invention is preferably selected from the following resins having bisphenol fluorene structural units as shown in Formula (1) to (3); however, it is for illustration only but not intends to limit the present invention.

Formula (1)

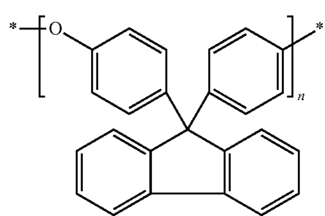

Formula (2)

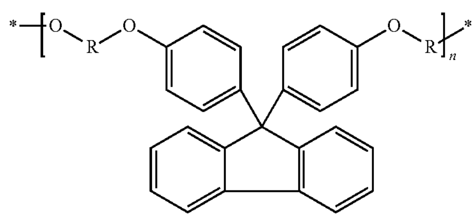

Formula (3)

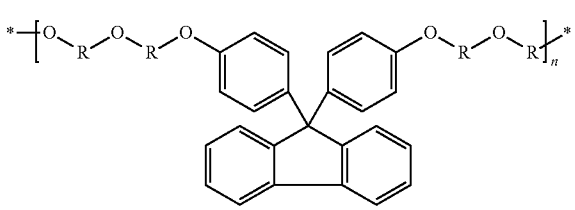

Wherein R in the Formula (1) to (3) has a structure selected from the following Formulas (4) to (11) with respects to different embodiments of the present invention:

Formula (4)

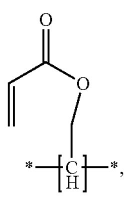

Formula (5)

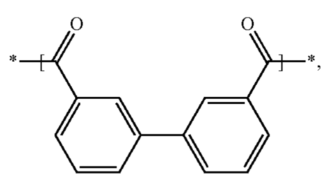

Formula (6)

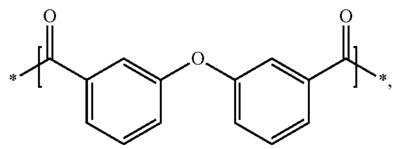

Formula (7)

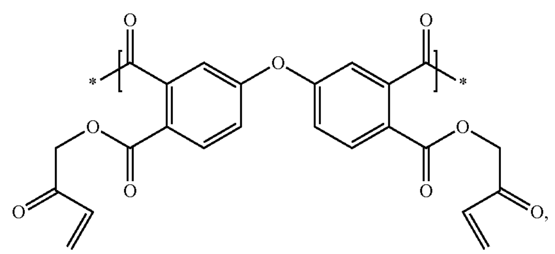

-continued

Formula (8)

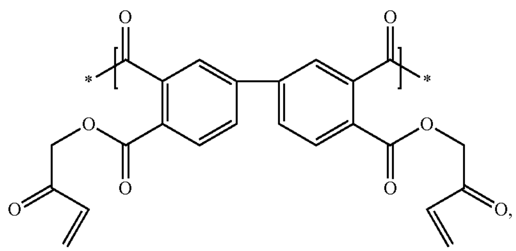

Formula (9)

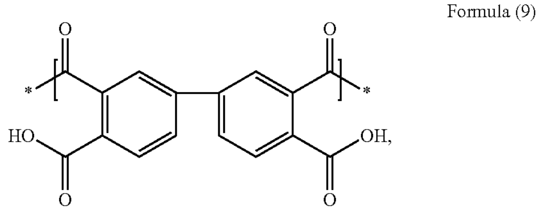

Formula (10)

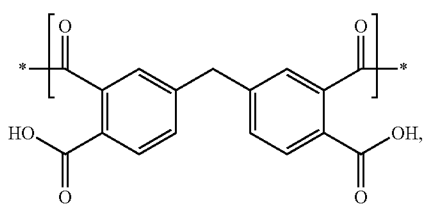

and

Formula (11)

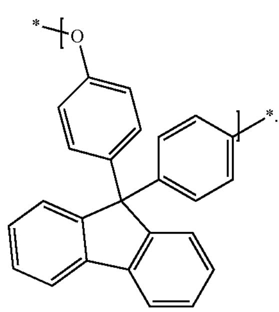

However, the R of the present invention is not limited to the above Formula (4) to (11). In other embodiments of the present invention, the R can be selected from a group consisting of an alkyl group having a carbon number of 1-12, a hydrocarbyl group, an alkoxy group, an aryloxy group, a heteroaryloxy group, an alkyl sulfide group, an aromatic sulfide group, a heteroaryl sulfide group, and an amino group.

More specifically, the (A) alkali soluble resin of the present invention is more preferably selected from at least one of the following bisphenol fluorine acrylate shown in Formula (12) to (14); however, the present invention is not limited thereto.

Formula (12)

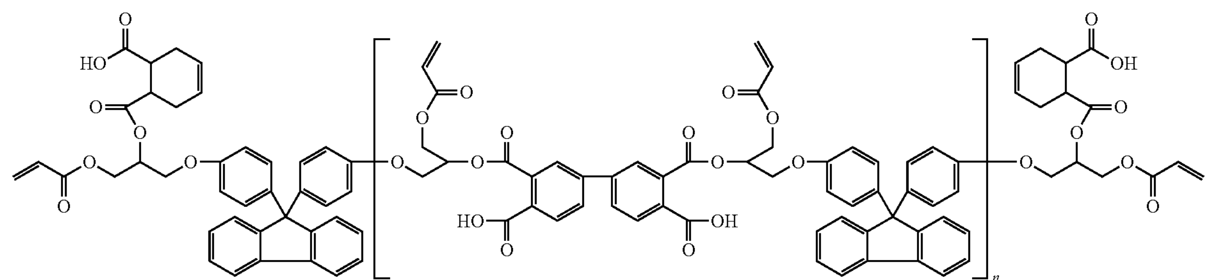

Formula (13)

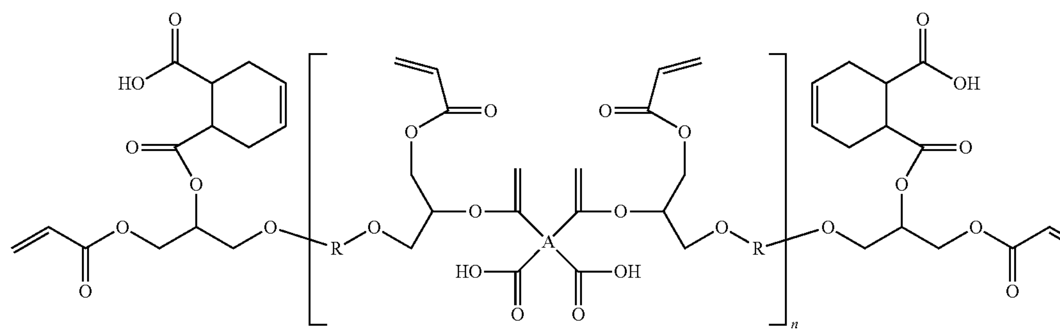

Formula (14)

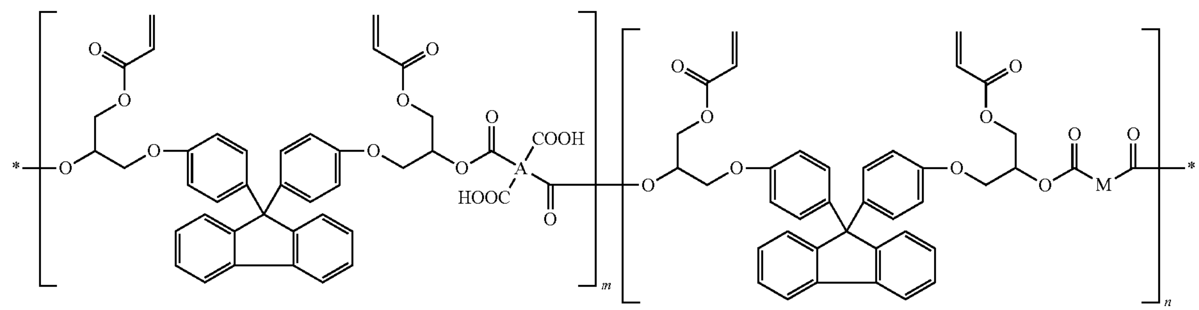

In the above Formula (12) to (14), n is an integer greater than 0 in the Formula (12); A is a residual group of a dianhydride compound after elimination of anhydride groups, wherein the dianhydride compound is selected from pyromellitic dianhydride, benzophenone tetracarboxylic dianhydride, biphenyl tetracarboxylic dianhydride, and diphenyl ether tetracarboxylic acid dianhydride diandydride; R is a bisphenol fluorene; M is a phenyl group or a benzyl group; and in and n are both an integer greater than 0 in the Formula (13) and (14).

The (A) alkali soluble resin of the present invention has a mass average molecular weight preferably greater than 2000 and less than 40000, and more preferably greater than 3000 and less than 30000. The composition contains 0.5-10 parts by weight of the (A) alkali soluble resin, preferably 1-10 parts by weight of the (A) alkali soluble resin, based on 100 parts by weight of the solid content of the composition as a reference. In the range of the amount of the (A) alkali soluble resin as above described, the composition has better equilibrium on optical sensitivity, developing ability, and resolution.

(B) Photoinitiator

The (B) photoinitiator is selected from at least one of an oxime ester compound, an alkyl phenyl ketone compound, a benzoin compound and a benzoin derivative. With a respect of high optical sensitivity, the (B) photoinitiator is preferably selected from at least one of the following: a benzoin compound, an acetyl benzene compound, benzoyl benzene compound, an acetophenone compound, an oxime ester compound, a benzophenone compound, and a diimidazole compound, but limited thereto.

The (B) photoinitiator of the present invention can mix two or more of the above described compounds with equal ratios. The (B) photoinitiator is in an amount of from 0.1-10 parts by weight, preferably 0.1-5 parts by weight, based on 100 parts by weight of the solid content of the composition as a reference. In the range of the amount of the (B) photoinitiator as above described, the composition has good resistances to heat and chemical reagents and improved optical curing ability.

(C) Unsaturated Monomer

The (C) unsaturated monomer of the present invention is an ethylenically unsaturated compound containing two or more ethylenically unsaturated group. For example, ethylene glycol dimethacrylate, dicyclopentenyl di(meth)acrylate, triethylene glycol diacrylate (TEGDA), trimethylolpropane tri(meth)acrylate, ethylene oxide (hereinafter referred to as EO)-modified trimethylolpropane triacrylate, propylene oxide (hereinafter referred to as PO)-modified trimethylolpropane triacrylate, neopentyl glycol di(meth)acrylate, pentaerythritol tri(meth)acrylate, pentaerythritol tetra(meth) acrylate, polyester di(meth)acrylate, polyethylene glycol di(meth)acrylate, dipentaerythritol penta(meth)acrylate, caprolactone-modified dipentaerythritol hexaacrylate, caprolactone-modified dipentaerythritol penta(meth)acrylate, PO-modified glycerol triacrylate, and so forth. But the present invention is not limited thereto.

Caprolactone-modified acrylates have properties of low viscosity, high hardness, fast curing ability, good flexibility, and good adhesiveness. Therefore, the (C) unsaturated monomer is preferably selected from caprolactone-modified dipentaerythritol penta(meth)acrylate and caprolactone-modified dipentaerythritol hexaacrylate. Moreover, EO-modified or PO-modified trimethylolpropane triacrylate has less viscosity and contractibility and higher photoactivity and homopolymerization than unmodified ones, and thus it can provide better flexibility and adhesiveness of a film produced thereof. And consequently, the (C) unsaturated monomer is preferably selected from EO-modified trimethylolpropane triacrylate, PO-modified trimethylolpropane triacrylate and PO-modified glycerol triacrylate.

The (C) unsaturated monomer of the present invention can mix two or more of the above described compounds with equal ratios. The (C) unsaturated monomer is in an amount of from 0.5-25 parts by weight, preferably 0.5-10 parts by weight, based on 100 parts by weight of the solid content of the composition as a reference. In the range of the amount of the (C) unsaturated monomer as above described, the composition can result in good optical sensitivity and pattern definition.

(D) Pigment Mixture

The (D) pigment mixture of the present invention comprises a colorant dispersion and a pigment. It is preferably to have a weight ratio of the colorant dispersion to the pigment in a range of 60:40~70:30, and more preferably has a weight ratio of 64:36. That is, the ((D) pigment mixture is in an amount of from 55~98 parts by weight, preferably 70~95 parts by weight, based on 100 parts by weight of the solid content of the composition as a reference.

The colorant dispersion of the present invention comprises a benzodifuranone colorant (hereinafter referring as colorant(a)) having a structure as shown in Formula (Ia) or isomers thereof, and a perylene colorant (hereinafter referring as colorant(b)) having a structure as shown in Formula (Ib) or Formula (Ic), and therefore the composition can have high absorption to a visible light and high transmittance to an infrared ray. A weight ratio of colorant(a) to colorant(b) is in a range of 10:90~80:20, and preferably in a range of 10:90~60:40.

Formula (Ia)

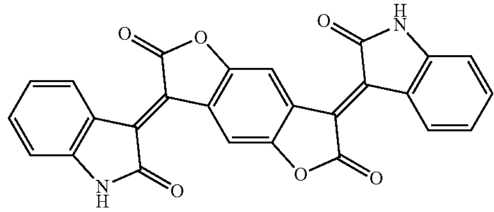

-continued

Formula (Ib)

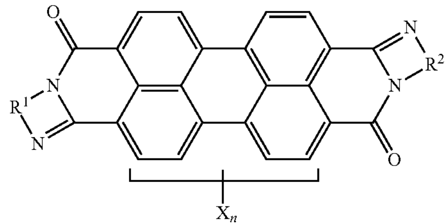

Formula (Ic)

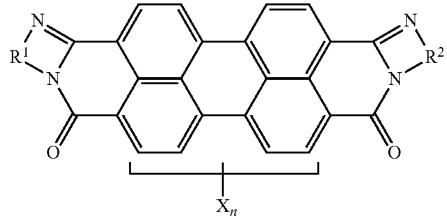

In the Formula (Ib) and Formula (Ic), $R^1$ and $R^2$ respectively and individually are selected from 1,2-phenylene, 1,8-naphthylene, 1,2-naphthylene, 2,3-naphthylene, 2,3-pyridylene and 3,4-pyridylene, and wherein the above phenylenes, naphthylenes and pyridylenes respectively and individually can be formed by monosubstitution or polysubstitution of $C_1$-$C_{12}$ alkyl group, $C_1$-$C_6$ alkoxy group, hydroxyl group, nitro group, and/or halogen, especially said phenylenes or naphthylenes are preferably individually substituted; X represents halogen, especially chlorine or bromine; and n is 0, 1, 2, 3, or 4.

The pigment of the present invention, for example, can be selected from pyrrolopyrrole dione type pigment, azo type pigment, phthalocyanine type pigment, anthraquinone type pigment, quinacridone type pigment, dithiazine type pigment, perylene type pigment, pyrene type pigment, indigo type pigment, isoindolinone type pigment, and metal complexes pigment, and more specifically, metal-free phthalocyanine blue (BGS LA-61-02), C.I. pigment blue 15:6, C.I. pigment red 254, C.I. pigment yellow 139, C.I. pigment purple 23, and C.I. pigment green 58. However, the present invention is not limited thereto.

While the (D) pigment mixture comprises one or more types of colorants and pigments, it is preferably that colorant dispersion further includes a dispersant in order to make the pigment(s) disperse well and also make the (D) pigment mixture stable. The dispersant is preferably polymeric, and a weight percentage of the dispersant to the (D) pigment mixture is less than 40 wt %, and further preferably less than 35 wt %. A suitable polymeric dispersant is able to improve a dispersity of the pigment(s) and decrease attraction between particles of the pigment(s). Preferable polymeric dispersant, for examples, are polycarboxylic ester, unsaturated polyamide, (part of) ammonium of polycarboxylic acid, alkyl ammonium, polysiloxanes, and modified derivatives thereof, and dispersants with the following trade names: Disperbyk® 101, 115, 130, 140, 160, 161, 163, 165, 170, 171, 180, 182, 2000, 2050, 2090, and analogues thereof; EFKA® 4008, 4009, 4010, 4015, 4020, 4044, 4060, 4300, 4320, 4340, and 7700; Ajisper® PB 711, 821, 823, 824, and 827; Solsperse® 13240, 13940, 17000, 28000, 20000, 12000, 31845, 32000, 32500, 44000, 53095 and combination thereof, but the present invention is not limited therein.

(E) Solvent

The (E) solvent of the present invention, for example, is 1,2,3-trichloropropane, 1,3-butanediol, benzyl alcohol, 1,3-butanediol diacetate, 1,4-dioxane, 2-heptanone, 2-methyl-1,3-propanediol, cyclohexanone, 3-methoxy-1-butanol, 3-methoxy-butyl acetate, 4-heptanone, m-xylene, m-diethyl benzene, m-dichlorobenzene, N,N-diemethylacetamide, n-butylbenezene, n-propyl acetate, N-pyrrolidone, o-xylene, p-diethyl benzene, o-dichlorobenzene, 4-chlorotoluene, isophorone, ethylene glycol diethyl ether, ethylene glycol dibutyl ether, ethylene glycol methyl ether acetate, ethylene glycol ethyl ether acetate, diisobutyl ketone, cyclohexanol acetate, dipropylene glycol dimethyl ether, dipropylene glycol monomethyl ether acetate, propylene glycol monomethyl ether acetate (PGMEA), propylene glycol ethyl ether acetate, propylene glycol monopropyl ether, methyl isobutyl ketone, methylcyclohexanol, or any combination thereof, but the present invention is not limited therein.

From the aspect of dispersity or solubility of the colorants, it preferably uses alcohol acetates, such as propylene glycol monomethyl ether acetate (PGMEA), propylene glycol ethyl ether acetate, ethylene glycol methyl ether acetate and ethylene glycol ethyl ether acetate, ketones, such as cyclohexanone, or aromatic alcohols, such as benzyl alcohol.

A weight percentage of the (E) solvent to the composition is in a range of 10-50 wt %.

Optional Additives

In additional to the above elements (A) to (E), the composition provided by the present invention can optionally comprise the following additives, but it is not intended to limit the present invention. In other embodiments, the composition can optionally comprise other additives depending on different needs. A weight percentage of whole additives to the composition is preferably more than 0.1 wt % and less than 20 wt %, and more preferably more than 0.1 wt % and less than 10 wt %.

In order to improve efficiency of the (B) photoinitiator, the composition provided by the present invention can optionally comprises one or more sensitizers, such as phenanthrene, anthracene, triphenylene, perylene, pyrene, phenazines, anthraquinones, carbazoles, acridines, thioxanthones, phthalocyanines, aromatic ketone compounds, and etc., having a absorption wavelength in a range of 300-450 nm.

According to the (B) photoinitiator used, the composition of the present invention can also optionally comprise chain transfer agent, for examples, N,N-dialkylamino alkyl benzoate and thiol compounds.

In order to improve adhesion of the composition to a substrate, the composition provided by the present invention can optionally comprises at least one adhesive, such as silane coupling agent, titanate coupling agent, and aluminum coupling agent.

In order to improve coating ability of the composition to a substrate, the composition provided by the present invention can optionally comprises at least one surfactant, for examples, fluorine surfactant, non-ionic surfactant, cationic surfactant, anionic surfactant, and silicone surfactant.

Infrared Ray Transmitting Filter and Fabricating Method Thereof

An infrared ray transmitting filter and its fabricating method thereof by applying the composition as aforementioned is illustrated in the following description.

The infrared ray transmitting filter provided by the present invention is to form colored patterns having the composition provided above on a transparent substrate, and the colored patterns are preferably black patterns. The fabricating method can be, for examples, a photolithography process and/or an ink jet process, but the present invention is not limited. From the aspect of easy to dispose desired minute pattern onto the substrate, the photolithography process is preferably used.

In the following description, the photolithography process is used to fabricate the infrared ray transmitting filter; however, it is for illustration only but not intended to limit the present invention.

FIG. 1 is a flow chart of steps of the fabricating method of infrared ray transmitting filter provided by the present invention. The method comprises: (S1) a step of disposing the composition of the present invention onto a transparent substrate to form an infrared ray transmitting layer (step of forming a colored layer); (S2) a step of exposing the infrared ray transmitting layer through a patterned mask (exposing step); and (S3) a step of developing the infrared ray transmitting layer to pattern the infrared ray transmitting layer in order to form infrared ray transmitting patterns (developing step).

(S1) Step of Forming A Colored Layer

In the step (S1), the composition provided by the present invention is coated onto the transparent substrate to form the colored layer (the infrared ray transmitting layer). The coating method can be, for instances, slit coating method, ink jet method, spin coating method, and screen printing method. Materials of the substrate is not limited; for instances, the substrate can be a transparent silicon substrate or a transparent sapphire substrate, or other materials suitable for forming an anti-reflective film and then coating the composition of the present invention thereon. Moreover, other processes, such as additional film forming process, are not limited in the present invention.

Then the colored layer coated on the substrate is heated by a heated plate or in an oven under a temperature condition in a range of 50° C.~120° C. for 10~300 seconds (preheating). A thickness of the coloring layer is in a range of 0.6 μm-1.8 μm, preferably in a range of 0.8 μm-1.2 μm.

(S2) Exposing Step

In the step (S2), the colored layer the infrared ray transmitting layer) is then exposed by using a patterned photomask. Radioactive rays used in the exposure include X-ray and ultraviolet ray, and radiation devices can be, for example, g-line stepper, h-line stepper, i-line stepper, KrF stepper, and etc. Irradiation intensity is preferably in a range of 800 $J/m^2$~2200 $J/m^2$.

(S3) Developing Step

Then the (S3) developing step is performed to dissolve the unexposed portion of the coloring layer by the patterned photomask into developing solution. The developing solution can be applied by shower spraying, mist spraying, soaking, and plating, and optionally with oscillation, spinning, and/or ultrasound oscillation. The (S3) developing step is performed under a temperature in a range of 20° C.-30° C. for 20-90 seconds.

The developing solution, for examples, is selected from alkali agents, such as sodium hydroxide (NaOH), potassium hydroxide (KOH), ammonia, ethylamine, diethylamine, dimethylethanolamine (DMEA), and tetramethyl ammonium hydroxide. It is preferably to dilute the alkali agent(s) with pure water to 0.001 wt %~1 wt %.

Optional Step(s)

After performing the above step (S1) to (S3), it is optionally to perform a heating process by a heated plate or oven under a temperature in a range of 150° C.~270° C. for 5~30 minutes (post-heating) in order to ensure the infrared ray transmitting patterns is completely cured.

Infrared Ray Sensor

The infrared ray sensor includes the infrared ray transmitting filter and other necessary photograph hardware/elements. The following are infrared ray sensors according to different embodiments of the present invention.

In an embodiment of the present invention, the infrared ray sensor comprises: a substrate; a solid-state imaging device on the substrate (for examples, charge coupled device (CCD) sensor, complementary metal-oxide semiconductor (CMOS) sensor, organic CMOS sensor, and etc.), having a light receiving region and an opening in the light receiving region, and comprises a plurality of photodiodes and a plurality of transfer electrodes; a light-shielding film, covering the plurality of photodiodes and the plurality of transfer electrodes disposed only in the opening, wherein the light-shielding film is made of tungsten; a protective film, disposed on the light-shielding film covering the plurality of photodiodes in the light receiving region, wherein the protective film comprises silicon nitride; and the infrared ray transmitting filter of the present invention, disposed on the protective film.

Optionally, the infrared ray sensor further comprises a light condenser, disposed in between the protective film and the infrared ray transmitting filter (i.e. disposed on the protective film and covered by the infrared ray transmitting filter). And optionally, the light condenser is disposed on the infrared ray transmitting filter. The light condenser can be, for example, micro lens.

EMBODIMENTS

In the following description, specific embodiments of the present invention are provided in details to further illustrate the invention. However, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

Fabrication of the (A) Alkali Soluble Resin

Bisphenol fluorene and epichlorohydrin with a molar ratio of 2:1 are added into a flask with four neck, and then it is mechanically stirred under a nitrogen condition until its temperature rises to 45° C., and after complete dissolving, a proper amount of hexadecyl trimethyl ammonium bromide and sodium hydroxide solution, and an etherification reaction is carried out under a temperature condition in a range of 54° C.~58° C. for 60~90 minutes. After the etherification reaction completes, excess of epichlorohydrin are removed to obtain epoxy-group-containing bisphenol fluorene having an epoxide equivalent of 235. Then dioxane and proper amount of sodium hydroxide are added, wherein a molar ratio of dioxane to bisphenol fluorene is 2:1, and a refining reaction is carried on under a temperature in a range of 75° C.~85° C. for 60~150 minutes. After the refining reaction, acrylic acid is added to perform a polymerization reaction, wherein a molar ratio of acrylic acid to bisphenol fluorene is 3:2. The polymerization reaction is performed under a temperature in a range of 100° C.~110° C. for about 10 hours. Then bisphenol fluorene epoxy acrylate is acquired after removal of solvent.

80 parts by weight of the above bisphenol fluorene epoxy acrylate is added into a separable flask, and then 200 parts by weight of propylene glycol methyl ether acetate (PGMEA), 20 parts by weight of phthalic anhydride, and 80 parts by weight biphenyl tetracarboxylic dianhydride are added to react under a temperature in a range of 110° C.~115° C. for 2 hours to obtain yellow transparent alkali soluble resin solution. After the polymerization reaction, the polymer is extracted from the separable flask and solvent is removed in order to obtain an alkali soluble resin (A-1-1) as shown in Formula (12). An acid value of the alkali soluble resin (A-1-1) is 95.41 mg KOH/g, and its weight average molecular weight is 4393.

100 parts by weight of the above bisphenol fluorene epoxy acrylate is added into a separable flask, and then 200 parts by weight of PGMEA, 20 parts by weight of phthalic anhydride, and 50 parts by weight biphenyl tetracarboxylic dianhydride are added to react under a temperature in a range of 110° C.~115° C. for 2 hours to obtain yellow transparent alkali soluble resin solution. After the polymerization reaction, the polymer is extracted from the separable flask and solvent is removed in order to obtain an alkali soluble resin (A-1-2) as shown in Formula (13). An acid value of the alkali soluble resin (A-1-2) is 93.55 mg KOH/g, and its weight average molecular weight is 5555.

100 parts by weight of the above bisphenol fluorene epoxy acrylate is added into a separable flask, and then 200 parts by weight of PGMEA, 20 parts by weight of phthalic anhydride, and 50 parts by weight diphenyl ether tetracarboxylic acid dianhydride are added to react under a temperature in a range of 110° C.~115° C. for 2 hours to obtain yellow transparent alkali soluble resin solution. After the polymerization reaction, the polymer is extracted from the separable flask and solvent is removed in order to obtain an alkali soluble resin (A-1-3) as shown in Formula (13). An acid value of the alkali soluble resin (A-1-3) is 99.72 mg KOH/g, and its weight average molecular weight is 3912.

100 parts by weight of the above bisphenol fluorene epoxy acrylate is added into a separable flask, and then 200 parts by weight of PGMEA, 50 parts by weight of phthalic anhydride, and 50 parts by weight biphenyl tetracarboxylic dianhydride are added to react under a temperature in a range of 110° C.~115° C. for 2 hours to obtain yellow transparent alkali soluble resin solution. After the polymerization reaction, the polymer is extracted from the separable flask and solvent is removed in order to obtain an alkali soluble resin (A-1-4) as shown in Formula (14). An acid value of the alkali soluble resin (A-1-4) is 95 mg KOH/g, and its weight average molecular weight is 4405.

A nitrogen gas inlet, a condenser, a stirrer, a heater, and a thermometer are set up on a flask. Nitrogen gas is firstly poured in to the flask, 5 parts of 2,2'-azobis-2-methylbutyronitrile, 220 parts by weight of ethyl 3-ethoxypropionate are added in, and then 55 parts by weight of styrene, 25 parts by weight of methacrylic acid, 15 parts by weight of a polymeric resin polymerized by methacrylic acid and glycidyl (meth)acrylate with a molar ration of 2:1, and 5 parts by weight of hydroxyethyl methacrylate are added in. It is stirred slowly until a temperature arise to 90° C., and a polymerization reaction is continuously carried on under the temperature of 90° C. for 6 hours. After the polymerization, solvent is removed and an alkali soluble resin (A-2-1) is obtained having a molecular weight (Mw) of 3600.

A nitrogen gas inlet, a condenser, a stirrer, a heater, and a thermometer are set up on a flask. Nitrogen gas is firstly poured in to the flask, 5 parts of 2,2'-azobis-2-methylbutyronitrile, 220 parts by weight of ethyl 3-ethoxypropionate are added in, and then 60 parts by weight of dicyclopentanyl (meth)acrylate, 33 parts by weight of methacrylic acid, and 7 parts by weight of a polymeric resin polymerized by methacrylic acid and glycidyl (meth)acrylate with a molar ration of 2:1 are added in. It is stirred slowly until a temperature arise to 80° C., and a polymerization reaction is continuously carried on under the temperature of 80° C. for 6 hours. After the polymerization, solvent is removed and an alkali soluble resin (A-2-2) is obtained having a molecular weight (Mw) of 3202.

A nitrogen gas inlet, a condenser, a stirrer, a heater, and a thermometer are set up on a flask. Nitrogen gas is firstly poured in to the flask, 5 parts of 2,2'-azobis-2-methylbutyronitrile, 220 parts by weight of ethyl 3-ethoxypropionate are added in, and then 60 parts by weight of N-phenylmaleimide, 28 parts by weight of methacrylic acid, and 12 parts by weight of a polymeric resin polymerized by methacrylic acid and glycidyl (meth)acrylate with a molar ration of 2:1 are added in. It is stirred slowly until a temperature arise to 80° C., and a polymerization reaction is continuously carried on under the temperature of 80° C. for 6 hours. After the polymerization, solvent is removed and an alkali soluble resin (A-2-3) is obtained having a molecular weight (Mw) of 5000.

A nitrogen gas inlet, a condenser, a stirrer, a heater, and a thermometer are set up on a flask. Nitrogen gas is firstly poured in to the flask, 5 parts of 2,2'-azobis-2-methylbutyronitrile, 220 parts by weight of ethyl 3-ethoxypropionate are added in, and then 60 parts by weight of benzyl (meth) acrylate, 28 parts by weight of methacrylic acid, and 12 parts by weight of a polymeric resin polymerized by methacrylic acid and glycidyl (meth)acrylate with a molar ration of 2:1 are added in. It is stirred slowly until a temperature arise to 80° C., and a polymerization reaction is continuously carried on under the temperature of 80° C. for 6 hours. After the polymerization, solvent is removed and an alkali soluble resin (A-2-4) is obtained having a molecular weight (Mw) of 3200.

A nitrogen gas inlet, a condenser, a stirrer, a heater, and a thermometer are set up on a flask. Nitrogen gas is firstly poured in to the flask, 5 parts of 2,2'-azobis-2-methylbutyronitrile, 220 parts by weight of ethyl 3-ethoxypropionate are added in, and then 60 parts by weight of styrene, 25 parts by weight of methacrylic acid, and 15 parts by weight of glycidyl (meth)acrylate. It is stirred slowly until a temperature arise to 80° C., and a polymerization reaction is continuously carried on under the temperature of 80° C. for 6 hours. After the polymerization, solvent is removed and an alkali soluble resin (A-2-5) is obtained having a molecular weight (Mw) of 5907.

Fabrication of the (D) Pigment Mixture

Example A of the Colorant (a)

Cis/trans isomers or tautomers of the Formula (Ia) is fabricated according to the example 1 of WO2010081624A.

Example B of the Colorant (b)

Cis/trans isomers ($R^1$ and $R^2$ are 1,2-phenylene; and n is 0) of the Formula (Ib) and (Ic) is fabricated according to the example 1 of US20070151478A.

Colorant Dispersion A

Example A and Example B are added into a 50 ml volumetric flask with a weight ratio of 30:70 (Example A: Example B) and a total of 2 g. Then 15 g of PGMEA, 0.5 g of dispersant (EFKA®4300, manufactured by BASF), 13 g of adhesive (SPC-2000, manufactured by Showa Highpolymer) are added, and then it is stirred until homogeneous state. Then 60 g of 0.5 mm of zircon beads are added in. Then the flask is sealed by an inner cap and applied to a paint regulator for 5 hours to obtain the black colorant dispersion A.

Fabrication of Color Filter

The colorant dispersion A (or referring as OBP) and C.I. pigment blue 15:6 (hereinafter referring as B15:6) are mixed together with a weight ratio of 64:36 to form a total of 100 g of a pigment mixture 1; the colorant dispersion A and the B15:6 are mixed with a weight ratio of 70:30 into a total of 100 g of a pigment mixture 2; the colorant dispersion A and the B15:6 are mixed together with a weight ratio of 60:40 to form a total of 100 g of a pigment mixture 3; the colorant dispersion A and the B15:6 are mixed together with a weight ratio of 75:25 to form a total of 100 g of a pigment mixture 4; the colorant dispersion A and the B15:6 are mixed together with a weight ratio of 55:45 to form a total of 100 g of a pigment mixture 5; and the B15:6 and C.I. pigment red 254 (hereinafter referring as R254) are mixed together with a weight ratio of 64:36 to form a total of 100 g of a pigment mixture 6.

25 parts by weight of the alkali soluble resin (A-1-1), 2.5 parts by weight of IRGACURE® OXE01 (manufactured by BASF), 2.5 parts by weight of IRGACURE® OXE02 (manufactured by BASF), 20 parts by weight of KAYARAD DPCA-60 (manufactured by Nippon Kayaku Co., Ltd), 20 parts by weight of NK ESTER APMT-3PO (manufactured by Shin-Nakamura Chemical Co., Ltd), 700 parts by weight of the pigment mixture 1, and 230 parts by weight of PGMEA are added and mixed in in sequence. It is stirred to mix well and then filtered by a microporous filter having an aperture of 0.5 μm in order to obtain a composition solution.

Following the same procedure as above illustrated to obtain different composition solutions by only changing components of the (D) pigment mixture or changing ratios of same components of the (D) pigment mixture without changing either components or amount of the (A) alkali soluble resin, the (B) photoinitiator, the (C) unsaturated monomer, and the (E) solvent. The composition solution individually is spin-coated onto a glass substrate, wherein a thickness of the coated composition is adjusted by speed of spinning. The substrate is then heated by a 90° C. heated plate for 2 minutes, and the Embodiment 1-8 of the color filters are therefore produced. Transmittance within a wavelength range of 400 nm~700 nm (visible light zone) and within a wavelength range of 900 nm~1300 nm (infrared zone) are measured individually by an ultraviolet-visible (UV-Vis) spectrophotometer. The results are shown in Table 1 below.

TABLE 1

| Embodiments | Pigment Mixtures | Components | Weight Ratio | Thickness of Color Filter | Transmittance in Visible Light Zone | Transmittance in Infrared Zone |
|---|---|---|---|---|---|---|
| Embodiment 1 | Pigment mixture 1 | OBP/B15:6 | 64/36 | 1.0 μm | <4% | >90% |
| Embodiment 2 | Pigment mixture 1 | OBP/B15:6 | 64/36 | 0.8 μm | >10% | >90% |
| Embodiment 3 | Pigment mixture 1 | OBP/B15:6 | 64/36 | 0.6 μm | >15% | >90% |

TABLE 1-continued

| Embodiments | Pigment Mixtures | Components | Weight Ratio | Thickness of Color Filter | Transmittance in Visible Light Zone | Transmittance in Infrared Zone |
|---|---|---|---|---|---|---|
| Embodiment 4 | Pigment mixture 2 | OBP/ B15:6 | 70/30 | 1.0 μm | <4% | >90% |
| Embodiment 5 | Pigment mixture 3 | OBP/ B15:6 | 60/40 | 1.0 μm | <4% | >90% |
| Embodiment 6 | Pigment mixture 4 | OBP/ B15:6 | 75/25 | 1.0 μm | 3%~10% | >90% |
| Embodiment 7 | Pigment mixture 5 | OBP/ B15:6 | 55/45 | 1.0 μm | >10% | >90% |
| Embodiment 8 | Pigment mixture 6 | B15:6/ R254 | 64/36 | 1.0 μm | >30% | >90% |

From the above Table 1, it is noted that a weight ratio of the dispersion of polymer to the pigment is preferably in a range of 60:40~70:30 in order to have a transmittance in visible light zone is below 4% and a transmittance in infrared light zone is more than 90% under a condition of forming the color filter of 1.0 μm in thickness on a substrate. When a more preferable weight ratio of 64:36 is used, differences of transmittance between different thicknesses are obviously observed. When a thickness of a color filter is 1.0 μm, the Embodiments 1, 4 and 5 has relatively low interference from visible light comparing with the Embodiments 6~8. In the following description, a fabrication of the composition of the present invention is provided according to the Embodiment 1 as an example for illustration.

Fabrication of the Composition

Compounds and amounts of each of the (A) alkali soluble resin, the (B) photoinitiator, the (C) unsaturated monomer, the (D) pigment mixture, and the (E) solvent are used as shown in Table 2 below, and in the (B) photoinitiator and the (C) unsaturated monomer individually include two compounds mixing with a ratio of 1:1. Then it is mixed by a shaking agitator to be well dissolved, and then it is filtered through a microporous filter having an aperture of 0.5 μm. The composition solutions of Example 1~5 and Comparison 1~5 are prepared following the procedure.

Fabrication of the Infrared Ray Transmitting Filter

The composition solutions of Example 1~5 and Comparison 1~5 are coated onto silicon wafers respectively by a spin coater, and then the wafers are heated by a 90° C. heated plates for 2 minutes (pre-heating process), separately and individually, in order to form a film having a thickness of 1.3 μm on each of the wafers.

An exposing process is performed on the pre-heated films by an i-ray apparatus (FDA-5500iza, manufactured by Canon, Ltd.) through 1.4 $mm^2$ and 1.1 $mm^2$ photomasks with irradiation intensity in a range of 800 $J/m^2$~2200 $J/m^2$.

A developing process is performed on the film using alkali developing solution under a temperature in a range of 23° C.~30° C. Then it is spin washed by shower of pure water, and high speed spinning is performed to remove residual water or water steam thereon. Afterward, the wafer is air dried and then heated by a heated plate for 5 minutes (post-heating process), and therefore infrared ray transmitting filters with colored patterns are formed.

Evaluations and Results

The infrared ray transmitting filters are evaluated by the following methods. The results are as shown in Table 3.

Resolution: using a scanning electron microscope (SEM; and the model used is 58840 produced by Hitachi, Ltd.) to observe critical dimension (CD) of the patterns. In the Table 3, different symbols represent different CD results, and the meaning of each symbol is illustrated as following:

TABLE 2

| | (A) Alkali Soluble Resin | | (B) Photoinitiator | | (C) Unsaturated Monomer | | (D) Pigment Mixture | | (E) Solvent | |
|---|---|---|---|---|---|---|---|---|---|---|
| | Compound | Parts by Weight | Compound | Parts by Weight | Compound | Parts by Weight | Compound | Parts by Weight | Compound | Parts by Weight |
| Example 1 | A-1-1 | 25 | B1/B2 | 5 | C1/C2 | 40 | D1 | 700 | E1 | 230 |
| Example 2 | A-1-1 | 40 | B1/B2 | 10 | C1/C3 | 10 | D1 | 450 | E1 | 450 |
| Example 3 | A-1-2 | 40 | B1/B2 | 10 | C1/C3 | 10 | D1 | 450 | E1 | 450 |
| Example 4 | A-1-3 | 40 | B1/B2 | 10 | C1/C3 | 10 | D1 | 450 | E1 | 450 |
| Example 5 | A-1-4 | 40 | B1/B2 | 10 | C1/C3 | 10 | D1 | 450 | E1 | 450 |
| Comparison 1 | A-2-1 | 40 | B1/B2 | 10 | C1/C3 | 10 | D1 | 450 | E1 | 450 |
| Comparison 2 | A-2-2 | 40 | B1/B2 | 10 | C1/C3 | 10 | D1 | 450 | E1 | 450 |
| Comparison 3 | A-2-3 | 40 | B1/B2 | 10 | C1/C3 | 10 | D1 | 450 | E1 | 450 |
| Comparison 4 | A-2-4 | 40 | B1/B2 | 10 | C1/C3 | 10 | D1 | 450 | E1 | 450 |
| Comparison 5 | A-2-5 | 40 | B1/B2 | 10 | C1/C3 | 10 | D1 | 450 | E1 | 450 |

B1: 1,2-Octanedione, 1-[4-(phenylthio)phenyl]-, 2-(O-benzoyloxime) (IRGACURE ® OXE01, manufactured by BASF)

B2: Ethanone, 1-[9-ethyl-6-(2-methylbenzoyl)-9H-carbazol-3-yl]-, 1-(O-acetyloxime) (IRGACURE ® OXE02, manufactured by BASF)

C1: caprolactone-modified hexaacrylate (KAYARAD DPCA-60, manufactured by Nippon Kayaku Co., Ltd)

C2: PO-modified trimethylolpropane triacrylate (NK ESTER APMT-3PO, manufactured byShin-Nakamura Chemical Co., Ltd)

C3: EO-modified trimethylolpropane triacrylate (NK ESTER APMT-3EO, manufactured by Shin-Nakamura Chemical Co., Ltd)

D1: pigment mixture 1

E1: PGMEA

◎: <1.1 μm

○: 1.1 μm~1.4 μm

Δ: 1.6 μm~2.0 μm

X: >2.0 μm

Figure 2A:
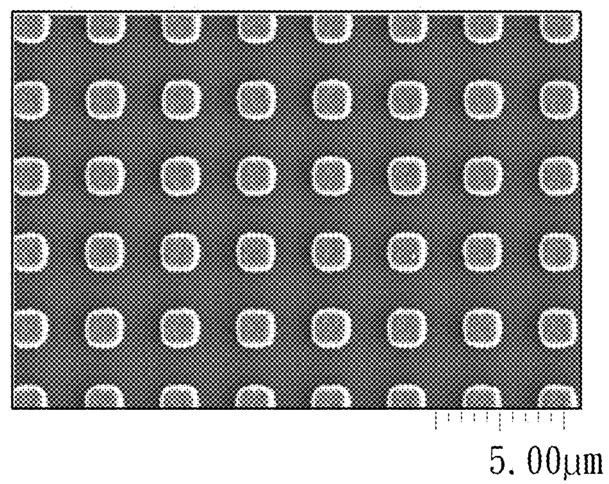
FIGS. 2A-2D are SEM pictures of the colored patterns of the different examples and comparisons according to the present invention.

Adhesion to Silicon Substrate: using the SEM to observe the colored patterns on the silicon substrate if the pattern is defected due to poor adhesion to the substrate (peeling/stripping from the substrate) or not. In the Table 3, the meaning of each symbol is illustrated as following:

◎: no defects, shown in FIG. 2A.

Figure 2B:
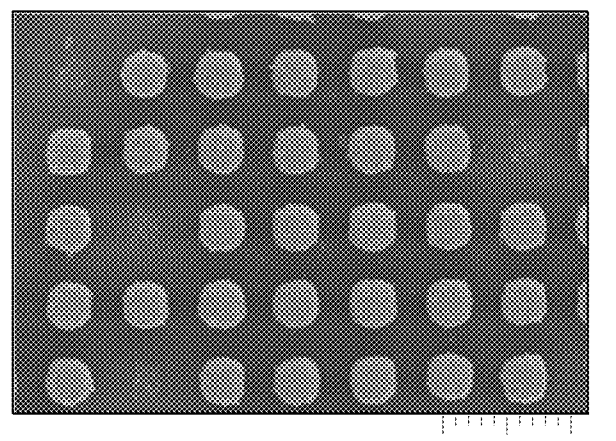

○: a little bit of stripping, shown in FIG. 2B. (without actual defects on the patterns)

Figure 2C:
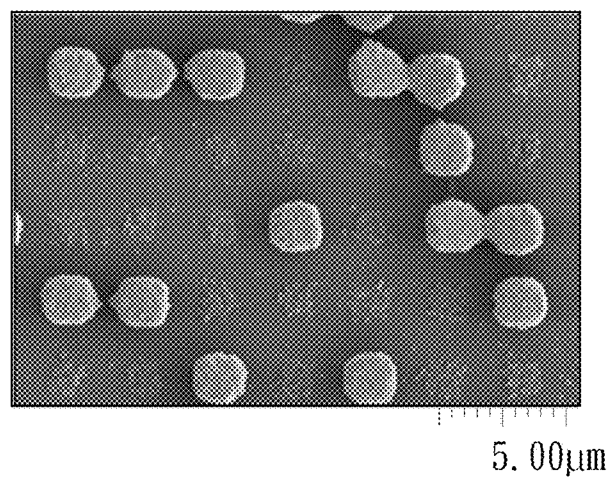

Δ: some defects, shown in FIG. 2C.

Figure 2D:
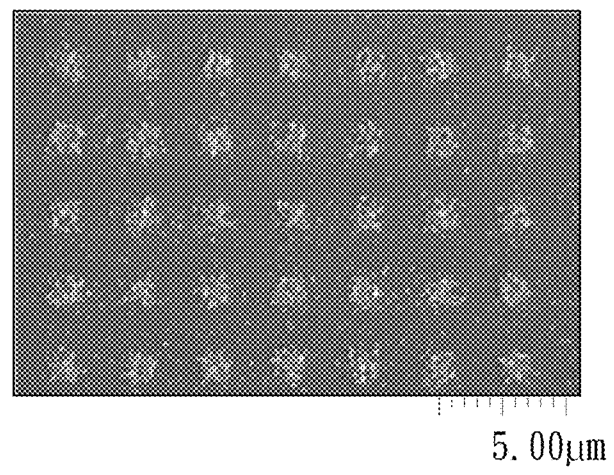

X: many defects, shown in FIG. 2D.

Residues from Developing Process: using the SEM to observe the surface of the silicon substrate if there is residue in the non-exposed area or not. In the Table 3, the meaning of each symbol is illustrated as following:

◎: no residues found

○: few residues

Δ: some residues

X: many residues

Spectral Characteristic: using a spin coater to coat the composition solution on the silicon substrate, then performing a pre-heating process by heating the substrate on a 90° C. heated plates for 2 minutes, and then using a UV-Vis spectrophotometer to measure transmittance in a wavelength range of 400 nm~700 nm (visible light zone) and in a wavelength range of 900 nm~1300 nm (infrared zone).

TABLE 3

| | Transmittance in Visible Light Zone | Transmittance in Infrared Zone | Resolution | Adhesion | Residues |
|---|---|---|---|---|---|
| Example 1 | <4% | >90% | ◎ | ◎ | ◎ |
| Example 2 | <4% | >90% | ◎ | ◎ | ◎ |
| Example 3 | <4% | >90% | ◎ | ◎ | ◎ |
| Example 4 | <4% | >90% | ◎ | ◎ | ◎ |
| Example 5 | <4% | >90% | ◎ | ◎ | ◎ |
| Comparison 1 | <4% | >90% | X | X | Δ |
| Comparison 2 | <4% | >90% | Δ | ○ | Δ |
| Comparison 3 | <4% | >90% | Δ | ○ | ○ |
| Comparison 4 | <4% | >90% | Δ | ○ | ○ |
| Comparison 5 | <4% | >90% | Δ | ○ | Δ |

From the above Table 3, it is noted that the infrared ray transmitting filters of the Embodiment 1~Embodiment 5 have overall better results (resolution, adhesion, and amount of residues) compare to the Comparison 1~Comparison 5, which contain no fluorene ring in the (A) alkali soluble resin. Moreover, the infrared ray transmitting filters of the Embodiment 1~Embodiment 5 of the present invention can have good resolution under 1.1 μm.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A composition, comprising:

an alkali soluble resin, including an acrylic group, a carboxyl group, and a fluorene ring;

a photoinitiator;

an unsaturated monomer;

a pigment mixture, having a weight ratio of a colorant dispersion to a pigment in a range of 60:40~70:30; and a solvent.

2. The composition according to claim 1, wherein the alkali soluble resin is a bisphenol fluorene acrylate.

3. The composition according to claim 1, wherein the photoinitiator is selected from a group consisting of oxime ester compounds, alkyl phenyl ketone compounds, benzoin compounds, benzoin derivatives, and a combination thereof.

4. The composition according to claim 1, wherein the unsaturated monomer is a mixture of caprolactone-modified acrylates and epoxy-alkanes-modified polyfunctional-group-containing acrylates.

5. The composition according to claim 1, wherein the colorant dispersion comprises:

a benzodifuranone colorant, having a structure as shown in Formula (Ia) isomers thereof; and Formula (Ia)

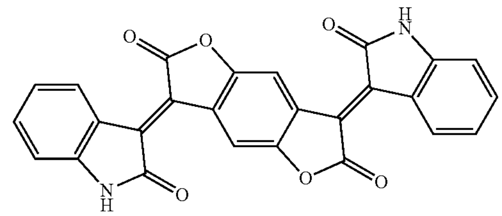

a perylene colorant, having a structure as shown in Formula (Ib) or Formula (IC), Formula (Ib)

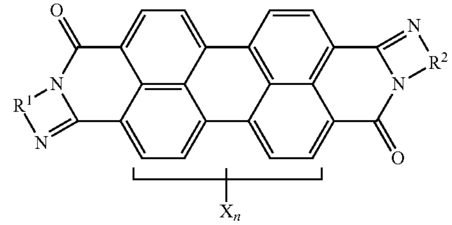

Formula (Ic)

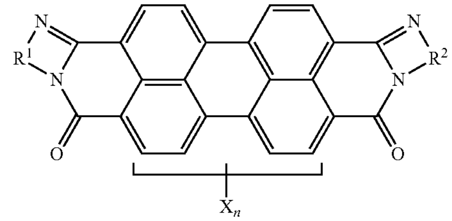

wherein $R^1$ and $R^2$ respectively and individually are selected from a group consisting of 1,2-phenylene, 1,8-naphthylene, 1,2-naphthylene, 2,3-naphthylene, 2,3-pyridylene and 3,4-pyridylene, and the phenylenes, naphthylenes and pyridylenes respectively and individually can be mono- or polysubstituted by $C_1$-$C_{12}$ alkyl group, $C_1$-$C_6$ alkoxy group, hydroxyl group, nitro group, and/or halogen; X is a halogen; and n is 0, 1, 2, 3, or 4.

6. The composition according to claim 5, wherein a weight ratio of the benzodifuranone colorant to the perylene colorant is in a range of 10:90~80:20.

7. The composition according to claim 1, wherein a weight percentage of the solvent to the composition is in a range of 10 wt %~50 wt %; and the composition contains 0.5~10 parts by weight of the alkali soluble resin, 0.1~10 parts by weight of the photoinitiator, 0.5~25 parts by weight of the unsaturated monomer, and 55~98 parts by weight of the pigment mixture per 100 parts by weight of the solid content of the composition.

8. The composition according to claim 1, wherein the colorant dispersion further includes a dispersant, and a weight percentage of the dispersant to the pigment mixture is less than 40 wt %.

9. A fabricating method of an infrared ray transmitting filter, comprising:

a step of disposing the composition according to claim 1 onto a substrate to form a an infrared ray transmitting layer;

a step of exposing the infrared ray transmitting layer through a patterned mask; and a step of developing the exposed infrared ray transmitting layer to pattern the infrared ray transmitting layer to form infrared ray transmitting patterns.

10. The method according to claim 9, before the step of exposing the infrared ray transmitting layer, further comprising:

pre-heating the infrared ray transmitting layer under a temperature in a range of 50° C.~120° C. for 10~300 seconds.

11. The method according to claim 9, after the step of developing the infrared ray transmitting layer, further comprising:

post-heating the patterned infrared ray transmitting layer under a temperature in a range of 150° ~270° C. for 5~30 minutes.

12. An infrared ray sensor, comprising:

a substrate;

a solid-state imaging device on the substrate, comprising a plurality of photodiodes and a plurality of transfer electrodes;

a light-shielding film, covering the plurality of photodiodes and the plurality of transfer electrodes;

a protective film, disposed on the light-shielding film covering the plurality of photodiodes; and the infrared ray transmitting filter disposed on the protective film, formed by the composition as claimed in claim 1.

* * * * *